(12) United States Patent
Choi et al.

(10) Patent No.: US 10,966,360 B2
(45) Date of Patent: Mar. 30, 2021

(54) APPARATUS FOR COMBINING PRINTED CIRCUIT BOARDS

(71) Applicant: SAMSUNG ELECTRONICS CO., LTD., Suwon-si (KR)

(72) Inventors: Young-Shin Choi, Asan-si (KR); Seul-Ki Han, Asan-si (KR); Myoun-Kyu Kang, Asan-si (KR); Ki-Bong Mun, Asan-si (KR); Du-San Baek, Gumi-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 133 days.

(21) Appl. No.: 16/383,821

(22) Filed: Apr. 15, 2019

(65) Prior Publication Data
US 2020/0084925 A1    Mar. 12, 2020

(30) Foreign Application Priority Data

Sep. 12, 2018  (KR) .......................... 10-2018-0108781

(51) Int. Cl.
*H05K 13/00* (2006.01)
*H05K 3/36* (2006.01)
*H05K 1/14* (2006.01)

(52) U.S. Cl.
CPC ........... *H05K 13/0069* (2013.01); *H05K 3/36* (2013.01); *H05K 1/148* (2013.01); *H05K 3/361* (2013.01);
(Continued)

(58) Field of Classification Search
CPC ........ H05K 1/028; H05K 1/147; H05K 1/148; H05K 3/36; H05K 3/361; H05K 3/365; H05K 3/366; H05K 3/368; H05K 13/0069; H05K 13/0406; H05K 13/0408; H05K 13/0409; H05K 13/041; H05K 13/0452; H05K 2201/04; H05K 2201/041; H05K 2201/042; H05K 2201/044;
(Continued)

(56) References Cited

U.S. PATENT DOCUMENTS

| 6,439,631 B1 | 8/2002 | Kress |
| 6,618,937 B2 * | 9/2003 | Onitsuka ............ H05K 13/0469 29/832 |

(Continued)

FOREIGN PATENT DOCUMENTS

| CN | 201110299903 | 10/2011 |
| CN | 201410158265 | 4/2014 |

(Continued)

*Primary Examiner* — Livius R. Cazan
*Assistant Examiner* — Joshua D Anderson
(74) *Attorney, Agent, or Firm* — F. Chau & Associates, LLC

(57) ABSTRACT

An apparatus for combining PCBs may include a pick-up mechanism, a gripping mechanism and a combining mechanism. The pick-up mechanism may pick-up the PCBs connected with each other by a flexible connection member. The gripping mechanism may grip a frame. The combining mechanism may press the flexible connection member using the frame to combine the PCBs with the frame. The process for combining the PCBs with the frame may be automatically performed so that a time for combining the PCBs with the frame is reduced and errors related to the combining process are decreased.

20 Claims, 20 Drawing Sheets

(52) U.S. Cl.
CPC . *H05K 2201/046* (2013.01); *H05K 2201/056* (2013.01); *H05K 2201/2018* (2013.01); *Y10T 29/53187* (2015.01); *Y10T 29/53191* (2015.01)

(58) Field of Classification Search
CPC ..... H05K 2201/046; H05K 2201/2018; H05K 2201/056; H05K 2203/1563; Y10T 29/49126; Y10T 29/53187; Y10T 29/53191; Y10T 29/53265
See application file for complete search history.

(56) References Cited

U.S. PATENT DOCUMENTS

| | | | |
|---|---|---|---|
| 7,729,276 B2 | 6/2010 | Akyol | |
| 7,835,389 B2 | 11/2010 | Yu et al. | |
| 8,089,984 B2 | 1/2012 | Diab | |
| 8,130,835 B2 | 3/2012 | Lee et al. | |
| 8,195,964 B2 | 6/2012 | Diab | |
| 8,228,795 B2 | 7/2012 | Conway et al. | |
| 8,259,716 B2 | 9/2012 | Diab | |
| 8,295,312 B2 | 10/2012 | Diab et al. | |
| 8,355,404 B2 | 1/2013 | Powell et al. | |
| 8,356,190 B2 | 1/2013 | Diab | |
| 8,422,512 B2 | 4/2013 | Yu et al. | |
| 8,451,384 B2 | 5/2013 | Gaddy et al. | |
| 8,462,674 B2 | 6/2013 | Diab et al. | |
| 8,565,105 B2 | 10/2013 | Diab et al. | |
| 8,654,636 B2 | 2/2014 | Conway et al. | |
| 8,787,022 B2 | 7/2014 | Moriai et al. | |
| 8,867,564 B2 | 10/2014 | Powell et al. | |
| 8,913,502 B2 | 12/2014 | Diab | |
| 8,982,753 B2 | 3/2015 | Diab | |
| 9,065,736 B2 | 6/2015 | Diab et al. | |
| 9,118,728 B2 | 8/2015 | Diab et al. | |
| 9,285,416 B2 | 3/2016 | Lee et al. | |
| 9,323,311 B2 | 4/2016 | Diab et al. | |
| 9,391,870 B2 | 7/2016 | Diab et al. | |
| 9,413,551 B2 | 8/2016 | Diab | |
| 9,461,809 B2 | 10/2016 | Powell et al. | |
| 9,479,681 B2 | 10/2016 | Gaddy et al. | |
| 9,515,843 B2 | 12/2016 | Diab et al. | |
| 9,537,781 B2 | 1/2017 | Conway et al. | |
| 9,995,787 B2 | 6/2018 | Lee et al. | |
| 2007/0074251 A1 | 3/2007 | Oguz et al. | |
| 2007/0212906 A1* | 9/2007 | Clayton | H01L 25/50 439/77 |
| 2010/0115306 A1 | 5/2010 | Diab | |
| 2010/0115316 A1 | 5/2010 | Diab | |
| 2010/0206454 A1* | 8/2010 | Maeda | H05K 3/386 156/60 |
| 2013/0111240 A1 | 5/2013 | Diab | |
| 2018/0246164 A1 | 8/2018 | Lee et al. | |

FOREIGN PATENT DOCUMENTS

| | | |
|---|---|---|
| KR | 10-0940927 | 2/2010 |
| KR | 10-0974177 | 8/2010 |
| KR | 10-0994773 | 11/2010 |
| KR | 10-2012-0014264 | 2/2012 |
| KR | 10-1215128 | 12/2012 |
| KR | 10-1495499 | 2/2015 |
| KR | 10-1767663 | 8/2017 |

* cited by examiner

US 10,966,360 B2

APPARATUS FOR COMBINING PRINTED CIRCUIT BOARDS

CROSS-RELATED APPLICATION

This application claims priority under 35 USC § 119 to Korean Patent Application No. 10-2018-0108781, filed on Sep. 12, 2018 in the Korean Intellectual Property Office (KIPO), the disclosure of which is incorporated by reference in its entirety herein.

TECHNICAL FIELD

Exemplary embodiments relate to an apparatus for combining printed circuit boards. More particularly, exemplary embodiments relate to an apparatus for combining two printed circuit boards connected to each other by a flexible connection member.

Discussion of Related Art

Generally, two printed circuit boards (PCB) connected to each other by a flexible connection member may be used in the SSD to increase the capacity of a solid state drive (SSD).

After mounting semiconductor chips on the PCBs, the PCBs may be bent along the flexible connection member. A frame may be interposed between the PCBs to prevent a short and damage to the bent PCBs.

According to related arts, a worker may manually combine the PCBs with the frame. However, the process for combining the PCBs with the frame may be overly time consuming. Further, the process may be difficult and burdensome for a worker to perform and the worker may make frequent errors in combining the PCBs with the frame.

SUMMARY

Exemplary embodiments provide an apparatus for combining PCBs that may be capable of automatically combining the PCBs with a frame.

According to exemplary embodiment, an apparatus for combining PCBs may include a pick-up mechanism configured to pick up the PCBs. The PCBs may have flexible connection members that are configured to connect two adjacent PCBs to each other. A gripping mechanism is configured to grip a frame. A combining mechanism is configured to press the flexible connection member using the frame to combine two adjacent PCBs with the frame. The frame is interposed between two adjacent PCBs after being combined by the combining mechanism.

According to another exemplary embodiment, an apparatus for combining PCBs may include a pick-up mechanism configured to pick up the PCBs. The PCBs may have flexible connection members that are configured to connect two adjacent PCBs to each other. A gripping mechanism is configured to grip a horizontally arranged portion of a frame. A rotating mechanism is configured to erect the frame gripped by the grippers. A combining mechanism is configured to press the flexible connection member using the frame to combine two adjacent PCBs with the frame. The frame is interposed between the two adjacent PCBs after being combined by the combining mechanism. A multi-joint robot is configured to transfer the pick-up mechanism and the gripping mechanism to the rotating mechanism and the combining mechanism.

According to another exemplary embodiment, a method for combining a plurality of printed circuit boards (PCBs) with frames, the PCBs having two adjacent PCBs connected to each other via a flexible connection member, includes: picking up the PCBs by a pick-up mechanism; gripping a frame by a gripping mechanism; and pressing the flexible connection member using the frame to combine two adjacent PCBs with the frame by a combining mechanism. The frame is interposed between two adjacent PCBs after being combined by the combining mechanism.

BRIEF DESCRIPTION OF THE DRAWINGS

Exemplary embodiments will be more clearly understood from the following detailed description taken in conjunction with the accompanying drawings.

FIG. 1 is a plan view illustrating an apparatus for combining PCBs in accordance with an exemplary embodiment;

FIG. 2 is a perspective view illustrating the apparatus in FIG. 1 in accordance with an exemplary embodiment;

FIG. 3 is a perspective view illustrating a pick-up mechanism and a gripping mechanism of the apparatus in FIG. 1 in accordance with an exemplary embodiment;

FIG. 4 is a perspective view illustrating a lower structure of the pick-up mechanism and the gripping mechanism in FIG. 3 in accordance with an exemplary embodiment;

FIGS. 5 to 8 are perspective views illustrating operations of a reversing mechanism of the apparatus in FIG. 1 in accordance with an exemplary embodiment;

FIGS. 9 and 10 are perspective views illustrating a rotating mechanism of the apparatus in FIG. 1 in accordance with an exemplary embodiment;

FIG. 11 is a perspective view illustrating a combining mechanism of the apparatus in FIG. 1 in accordance with an exemplary embodiment;

FIG. 12 is a perspective view illustrating a pressing member of the combining mechanism in FIG. 11 in accordance with an exemplary embodiment;

FIG. 13 is an enlarged perspective view of a portion "A" in FIG. 11 in accordance with an exemplary embodiment;

FIG. 14 is an enlarged perspective view of a portion "B" in FIG. 11 in accordance with an exemplary embodiment;

FIG. 15 is a perspective view illustrating a process for supplying a frame to a combining mechanism by a multi-joint robot in FIG. 1 in accordance with an exemplary embodiment;

FIG. 16 is a front view illustrating a process for supplying a frame to a combining mechanism by a multi-joint robot in FIG. 1 in accordance with an exemplary embodiment;

FIG. 17 is a perspective view illustrating a process for combining PCBs with a frame by a combining mechanism in accordance with an exemplary embodiment;

FIG. 18 is a front view illustrating a process for combining PCBs with a frame by a combining mechanism in accordance with an exemplary embodiment;

FIG. 19 is a perspective view illustrating an upper camera of an inspecting mechanism of the apparatus in FIG. 1 in accordance with an exemplary embodiment;

FIG. 20 is a perspective view illustrating a side camera of an inspecting mechanism of the apparatus in FIG. 1 in accordance with an exemplary embodiment;

FIG. 21 is a perspective view illustrating a lower camera of an inspecting mechanism of the apparatus in FIG. 1 in accordance with an exemplary embodiment; and FIGS. 22 to 25 are perspective views illustrating a process for combining PCBs with a frame by a combining mechanism in accordance with an exemplary embodiment.

DETAILED DESCRIPTION OF THE EMBODIMENTS

Hereinafter, exemplary embodiments will be explained in detail with reference to the accompanying drawings.

Figure 1:
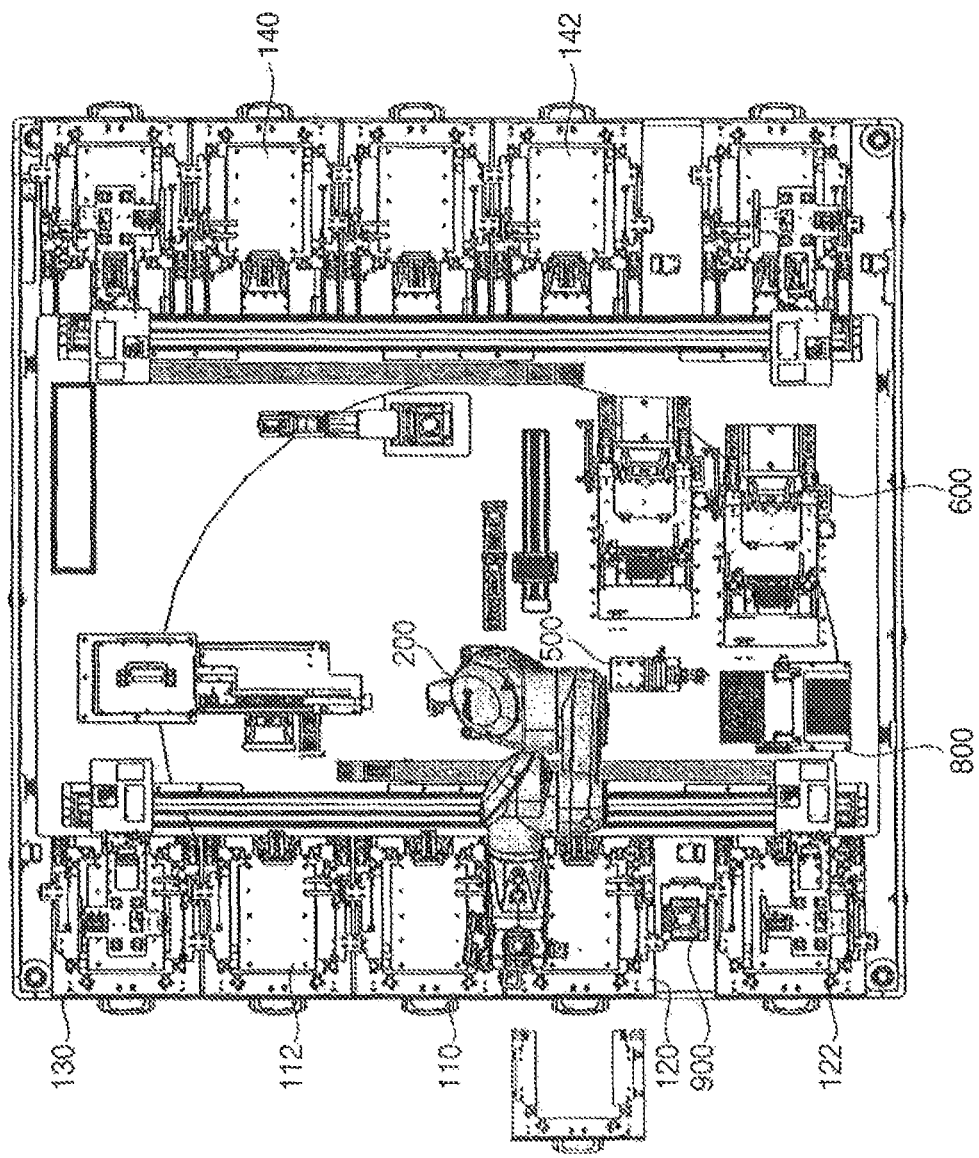
FIGS. 1 to 25 represent non-limiting, exemplary embodiments as described herein.
Figure 2:
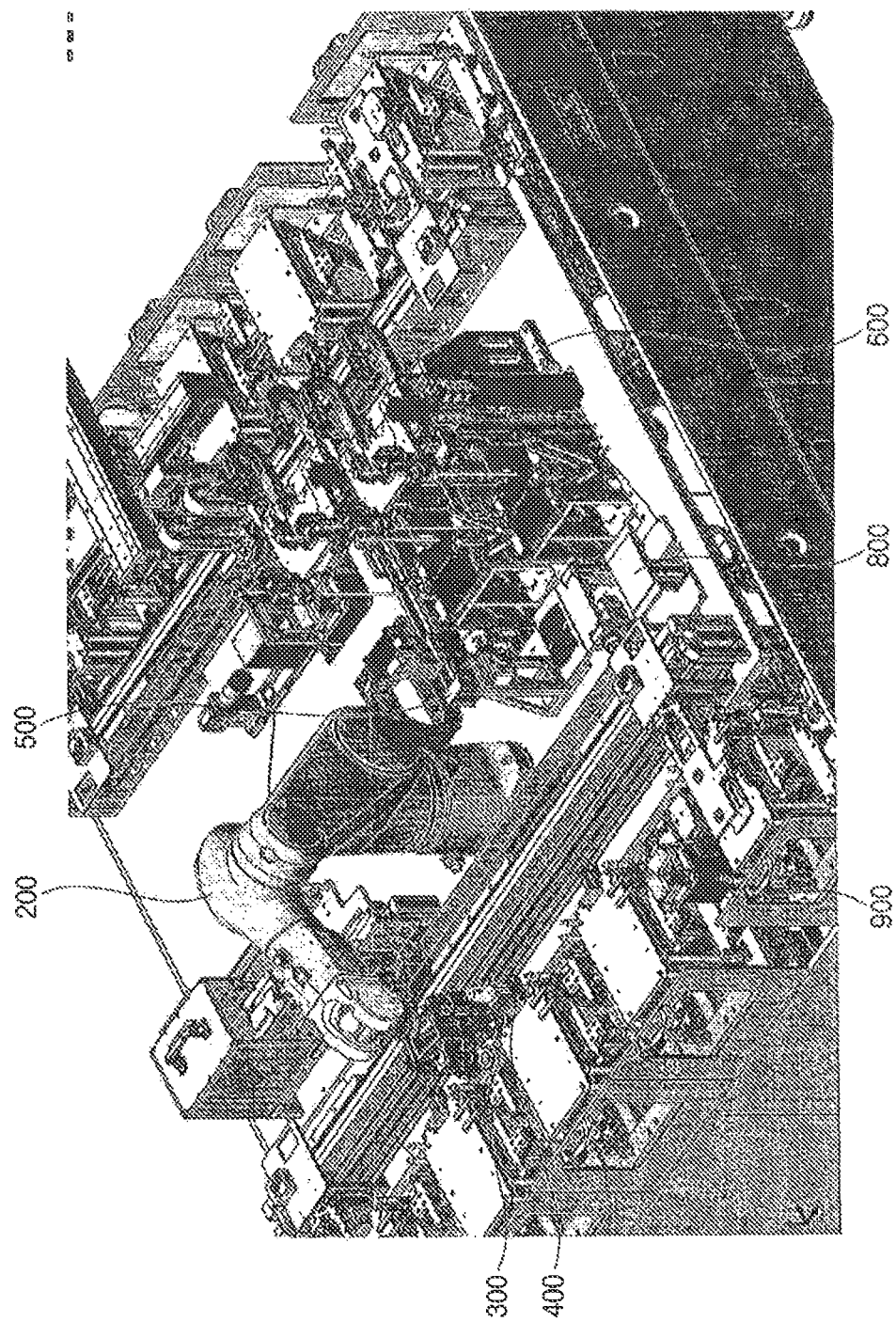

FIG. 1 is a plan view illustrating an apparatus for combining PCBs in accordance with exemplary embodiments. FIG. 2 is a perspective view illustrating the apparatus shown in FIG. 1.

Referring to FIGS. 1 and 2, a system for combining PCBs may include a loading apparatus, a combining apparatus and an unloading apparatus.

In one exemplary embodiment, the loading apparatus may include a PCB-loading mechanism 110, a frame-loading mechanism 120 and a radio-frequency identification ("RFID") loading mechanism 130. The PCB-loading mechanism 110 may be configured to load the PCBs. The frame-loading mechanism 120 may be configured to load frames. The RFID-loading mechanism 130 may be configured to load RFIDs.

In one exemplary embodiment, the PCBs may be stacked in a tray. The PCBs may be horizontally received in the tray. The PCB-loading mechanism 110 may be configured to receive the tray with the stacked, horizontally arranged PCBs. The two PCBs may be connected to each other via a flexible connection member. In one exemplary embodiment, the tray from which the PCBs may be unloaded may be transferred to a first tray stocker 112.

In one exemplary embodiment, the frames may be horizontally received in a tray. The tray loading mechanism 120 may be configured to receive the tray holding the frames. In one exemplary embodiment as shown in FIG. 1, the tray-loading mechanism 120 may be positioned adjacent to the PCB-loading mechanism 110. The tray from which frames may be unloaded may be transferred to a second tray stocker 122.

The RFID-loading mechanism 130 may be configured to recognize an RFID of each of the PCBs in the PCB-loading mechanism 110. Therefore, the types of the PCBs in the PCB-loading mechanism 110 may be identified by the RFID-loading mechanism 130 based on the RFIDs of the PCBs.

In one exemplary embodiment, the unloading apparatus may include a normal PCB-unloading mechanism 140 and an abnormal PCB-unloading mechanism 142. The normal PCB-unloading mechanism 140 may be configured to unload normal PCBs among the PCBs combined with the frame by the combining apparatus. The abnormal PCB-unloading mechanism 142 may be configured to unload abnormal PCBs among the PCBs combined with the frame by the combining apparatus.

In one exemplary embodiment, the combining apparatus may be arranged between the loading apparatus and the unloading apparatus. In one exemplary embodiment, the combining apparatus may include a multi-joint robot 200, a pick-up mechanism 300, a gripping mechanism 400, a rotating mechanism 500, a combining mechanism 600, a reversing mechanism 800, a vision mechanism 900 and an inspection mechanism.

Figure 3:
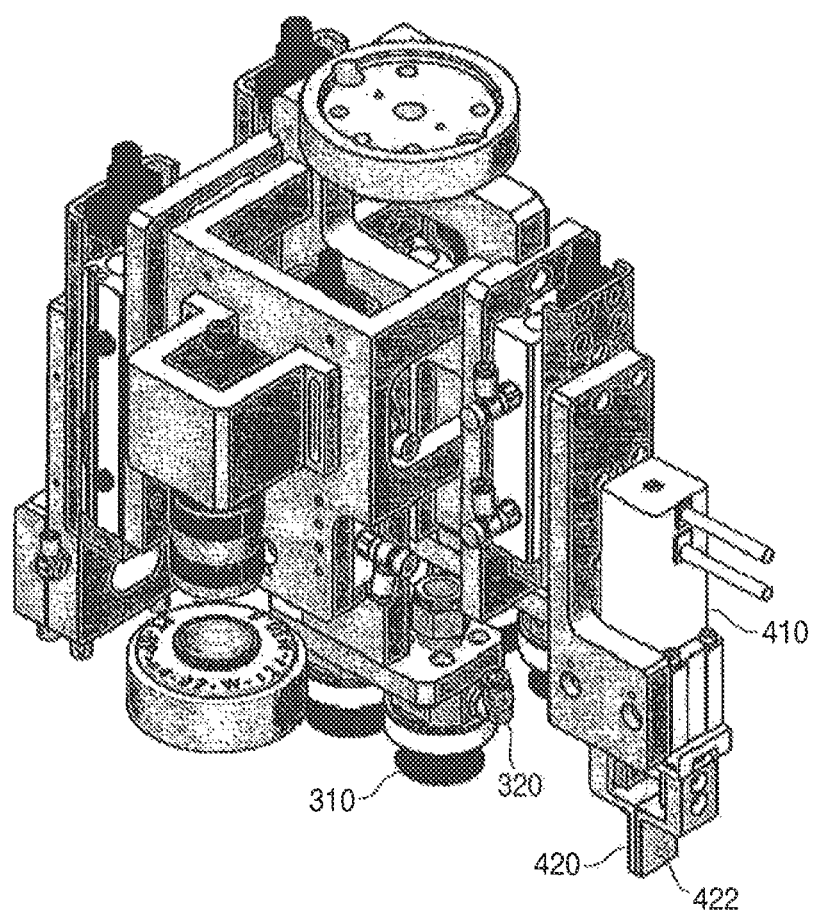
Figure 4:
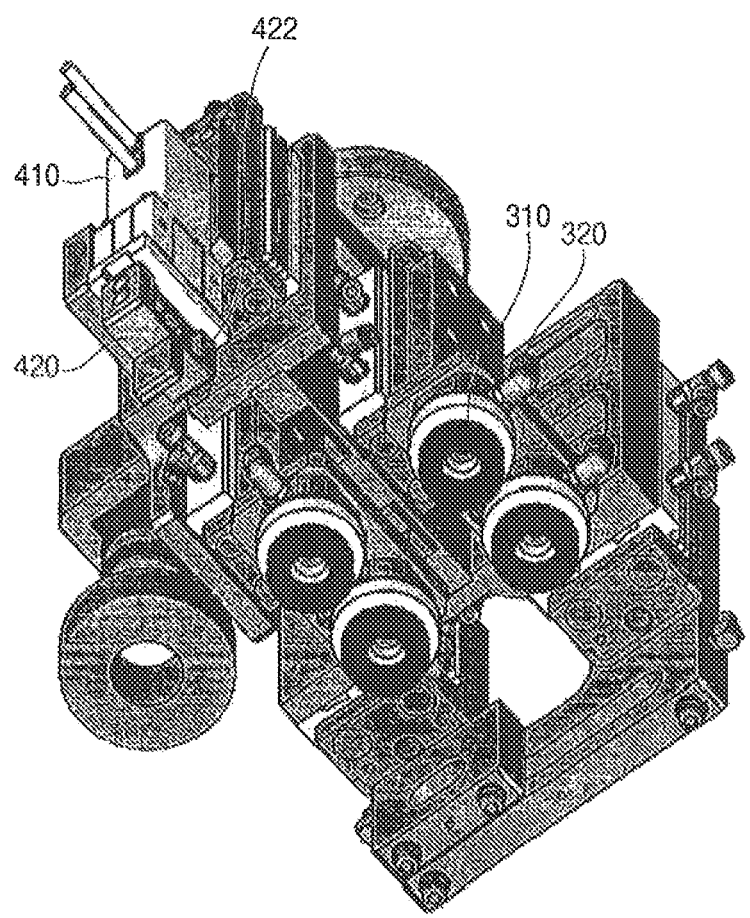
Figure 5:
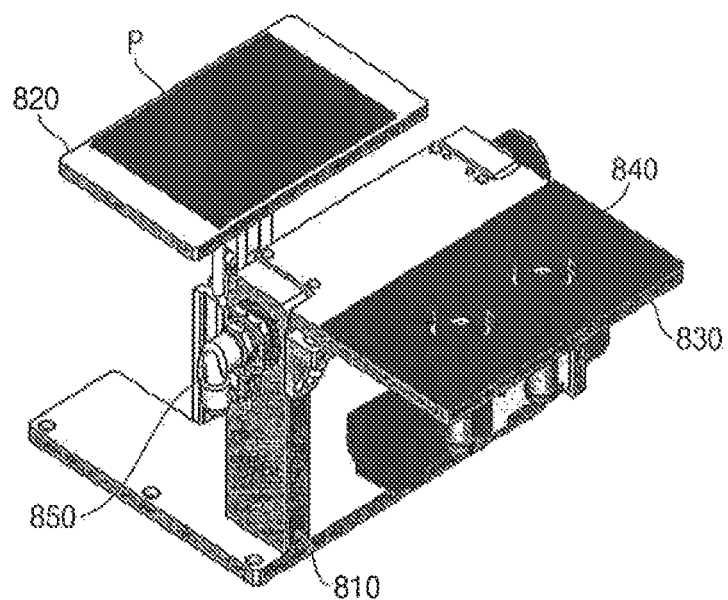
Figure 6:
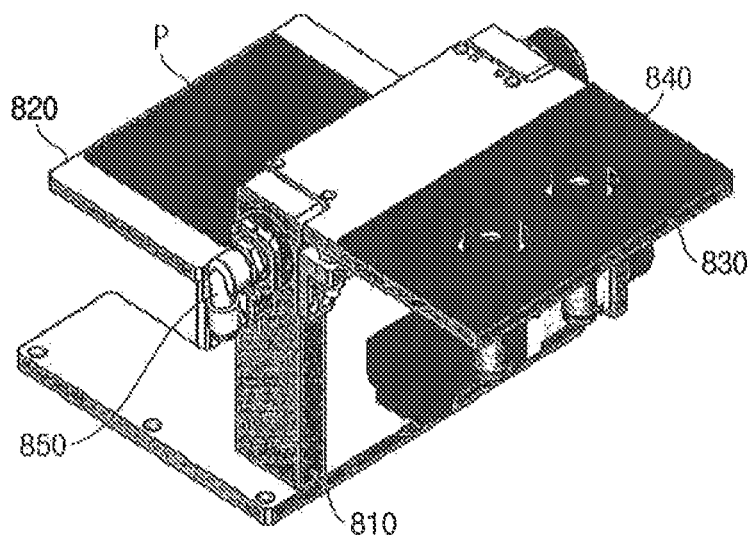
Figure 7:
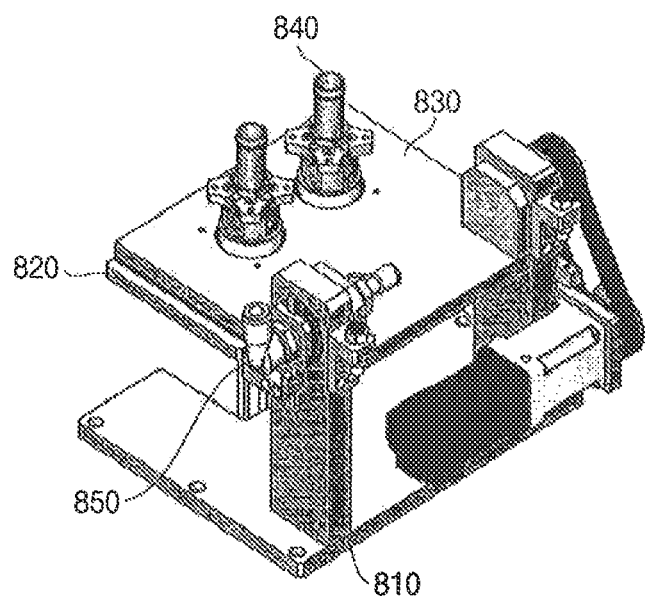
Figure 8:
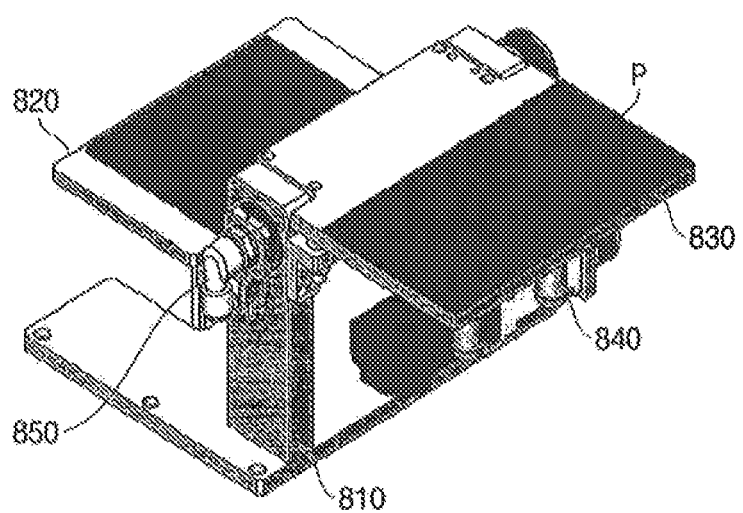

FIG. 3 is a perspective view illustrating a pick-up mechanism and a gripping mechanism of the apparatus in FIG. 1. FIG. 4 is a perspective view illustrating a lower structure of the pick-up mechanism and the gripping mechanism shown in FIG. 3.

Referring to FIGS. 3 and 4, the pick-up mechanism 300 and the gripping mechanism 400 may be connected to the multi-joint robot 200. The multi-joint robot 200 may be configured to transfer the pick-up mechanism 300 and the gripping mechanism 400.

The pick-up mechanism 300 may be configured to pick-up the PCBs that are loaded into the PCB-loading mechanism 110. In one exemplary embodiment, the pick-up mechanism 300 may include a vacuum pump and a plurality of vacuum pads 310. The vacuum pump may provide the vacuum pads 310 with a vacuum through a vacuum port 320.

The vacuum pad 310 may be configured to hold two PCBs P connected with each other via the flexible connection member using the vacuum provided from the vacuum pump. In one exemplary embodiment, the vacuum pad 310 may include a pad that is configured to utilize the Coanda effect. The vacuum pad 310 using the Coanda effect may hold the PCBs P by a non-contact manner. Thus, the vacuum pad 310 may hold the PCBs P without damaging the PCBs P on which the semiconductor chips may be mounted.

The gripping mechanism 400 may be configured to grip the frames F loaded into the frame-loading mechanism 120. In one exemplary embodiment, the gripping mechanism 400 may include an actuator 410 and a pair of grippers 420 and 422. The actuator 410 may include an air cylinder.

The grippers 420 and 422 may be configured to be opened and closed in the horizontal direction. The actuator 410 may be configured to move the pair of the grippers 420 and 422 in a horizontal direction to open and close the gripper. Thus, the grippers 420 and 422 may grip a side portion of the horizontally arranged frame F. Because the side portion of the frame F may be gripped by the horizontal closing of the gripper 420 and 422, the grippers 420 and 422 may firmly grip the side portion of the frame F regardless of a thickness of the frame F.

Referring again to FIGS. 1 and 2, the vision mechanism 900 may be configured to image (e.g., photograph) the PCBs P held by the vacuum pad 310 and the frame F gripped by the grippers 420 and 422. The images acquired by the vision mechanism 900 may be utilized to verify whether the PCBs P are accurately held by the vacuum pad 310 and if the frame F is accurately gripped by the grippers 420 and 422. For example, PCBs P that may be reversely held by the vacuum pad 310 may be verified based on the images obtained by the vision mechanism 900. When the PCBs P may not be accurately held by the vacuum pad 310 and/or the frame F may not be accurately gripped by the grippers 420 and 422, the apparatus may be configured to perform additional processes for aligning the PCBs P and/or the frame F.

FIGS. 5 to 8 are perspective views illustrating operations of a reversing mechanism of the apparatus in FIG. 1.

Referring to FIGS. 5 to 8, the reversing mechanism 800 may be configured to reverse the PCB P held by the vacuum pad 310. Therefore, if the images acquired by the vision mechanism 900 indicate that the PCB P is reversely held by the vacuum pad, the reversing mechanism may be utilized to reverse the PCB. When the vision mechanism 900 does not find a reversed PCB P, the combining apparatus may not include the reversing mechanism 800. In one exemplary embodiment, the reversing mechanism 800 may include a reversing frame 810, a first table 820, a second table 830, a vacuum pad 840 and an actuator 850.

The first table 820 may be movably connected to the reversing frame 810 in the vertical direction. The second table 830 may be rotatably connected to the reversing frame 810. A vacuum pad 840 may be positioned on the second table 830. The actuator 850 may be configured to rotate the second table 830. The actuator 850 may include an air cylinder.

The PCBs P reversely held by the vacuum pad 310 may be placed on an upper surface of the first table 820. The first table 820 may be downwardly moved together with the PCBs P. The actuator 850 may be configured to rotate the second table 803 toward the first table 820 at an angle of about 180°. The second table 830 may then make contact with the PCBs P on the first table 820.

The vacuum pad 840 may be configured to hold the PCBs P using the vacuum suction provided by the vacuum. When the actuator 850 may rotate the second table 830 to an original position, the reversed PCBs P may be placed on an upper surface of the second table 830. The pick-up mechanism 300 may then be configured to pick up the PCBs P on the second table 830 using the vacuum.

Figure 9:
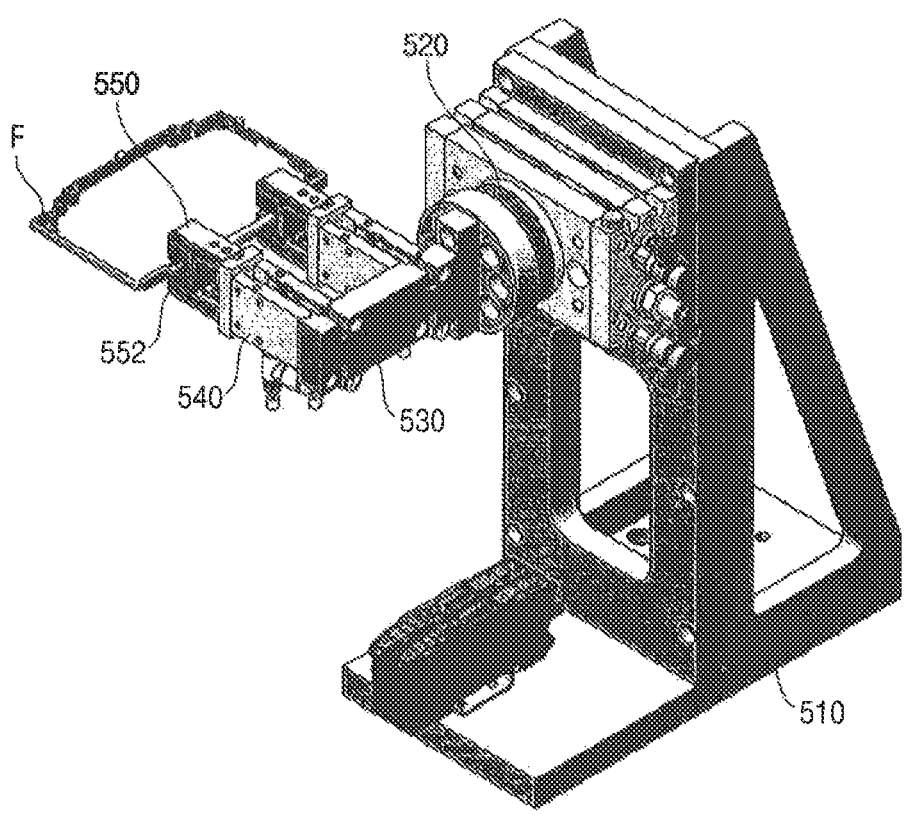
Figure 10:
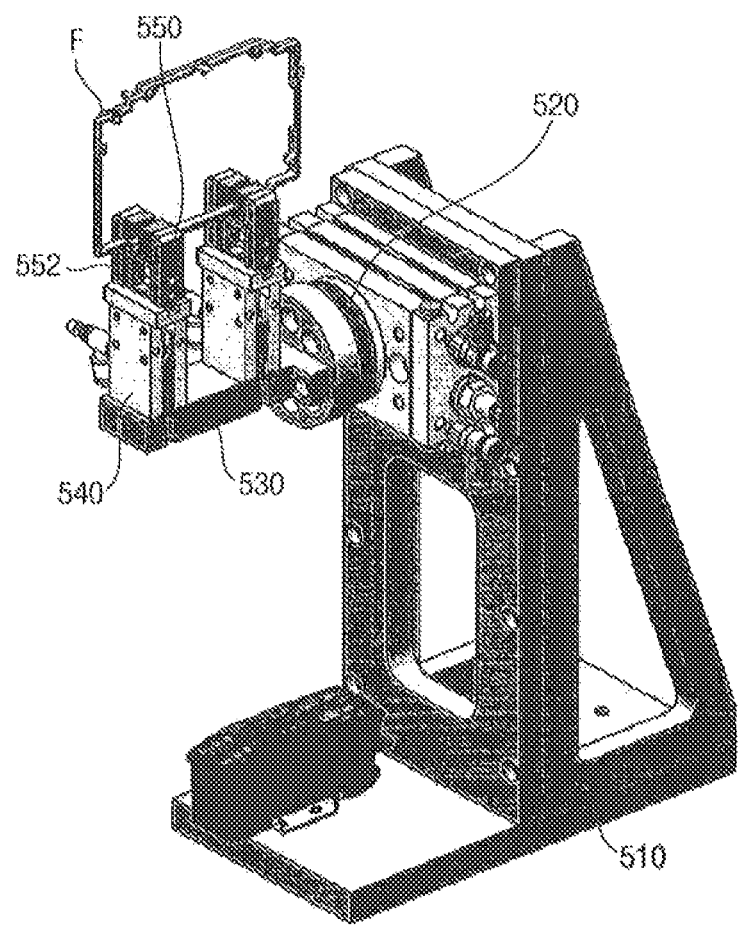

FIGS. 9 and 10 are perspective views illustrating a rotating mechanism of the apparatus in FIG. 1.

Referring to FIGS. 9 and 10, the rotating mechanism 500 may be configured to rotate the frame F horizontally gripped by the grippers 420, 422 at an angle of about 45° to erect the frame F. Alternatively, in exemplary embodiments where the grippers 420, 422 may grip the frame F in an erect orientation, the combining apparatus may not include the rotating mechanism 500.

In one exemplary embodiment, the rotating mechanism 500 may include a rotating frame 510, a first actuator 520, a bracket 530, a second actuator 540 and a pair of grippers 550, 552.

The first actuator 520 may be installed at the rotating frame 510. The bracket 530 may be rotated by the first actuator 520 with respect to a horizontal axis. The second actuator 540 may be installed at the bracket 530. In one exemplary embodiment, the grippers 550, 522 may be vertically arranged. The grippers 550, 552 may be opened and closed by the second actuator 540 in the vertical direction. The grippers 550, 552 may be configured to grip a side portion of the frame F.

Figure 11:
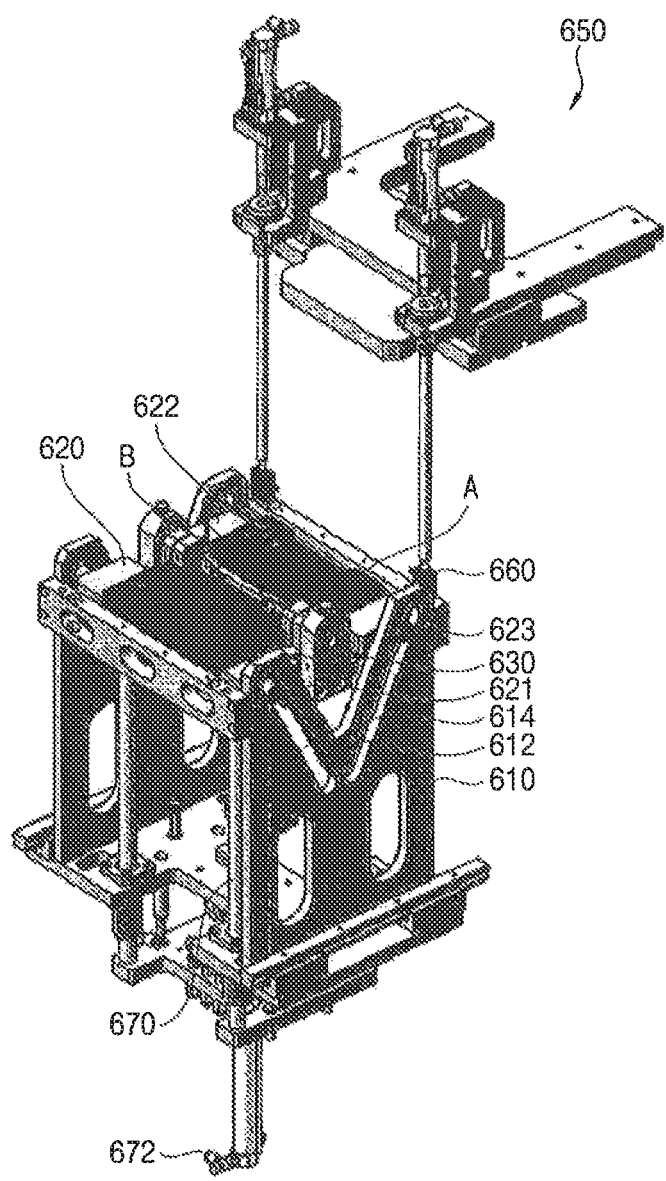
Figure 12:
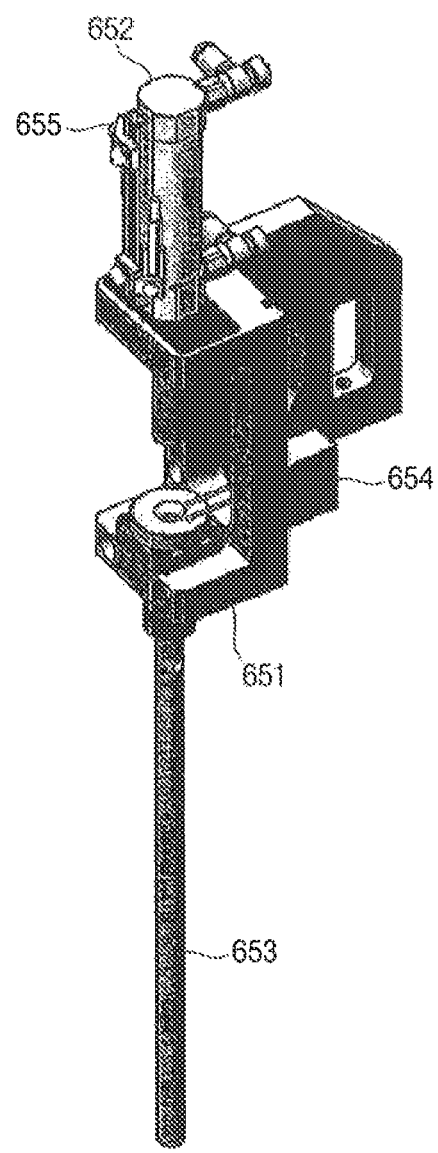
Figure 13:
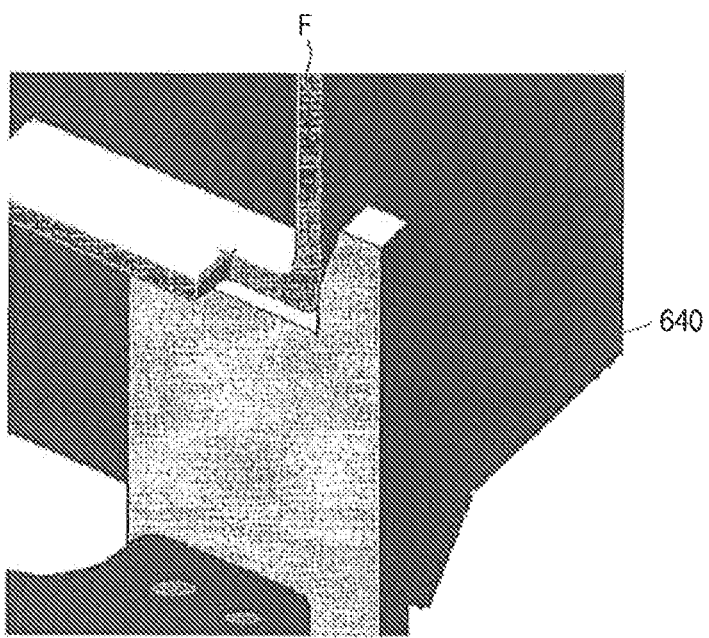
Figure 14:
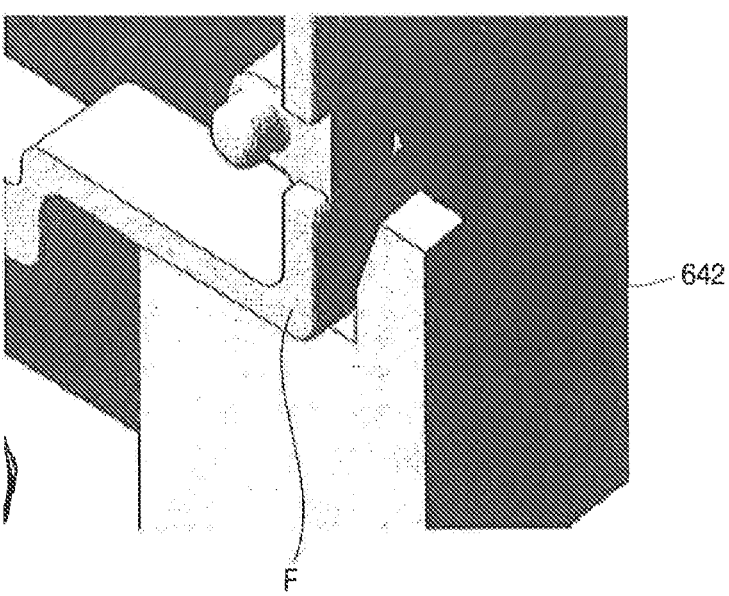
Figure 15:
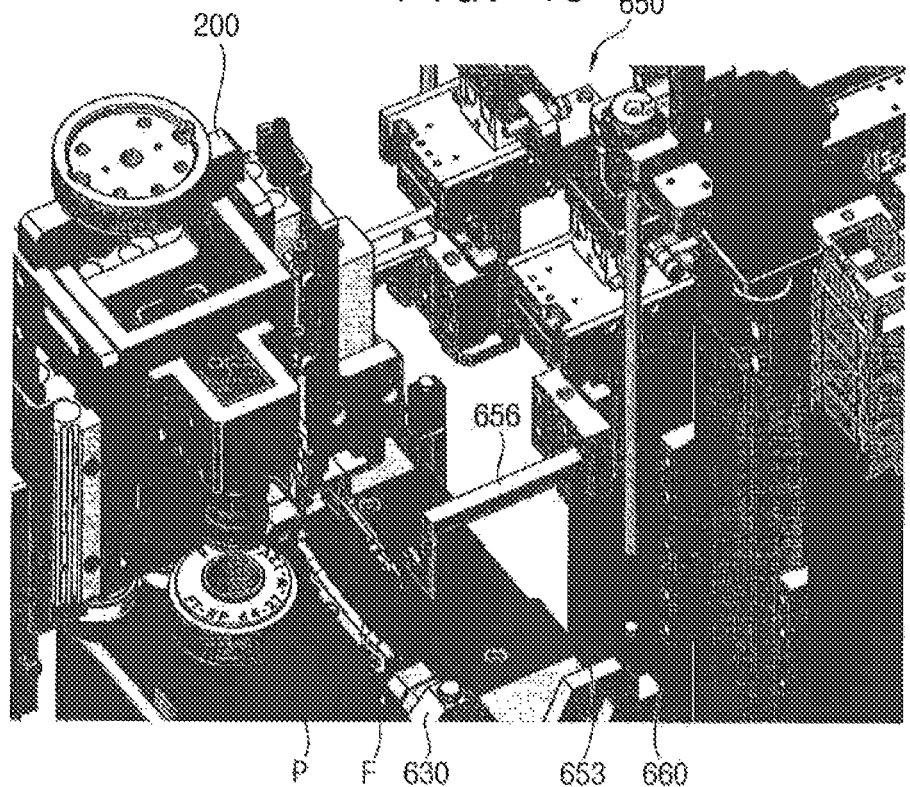
Figure 16:
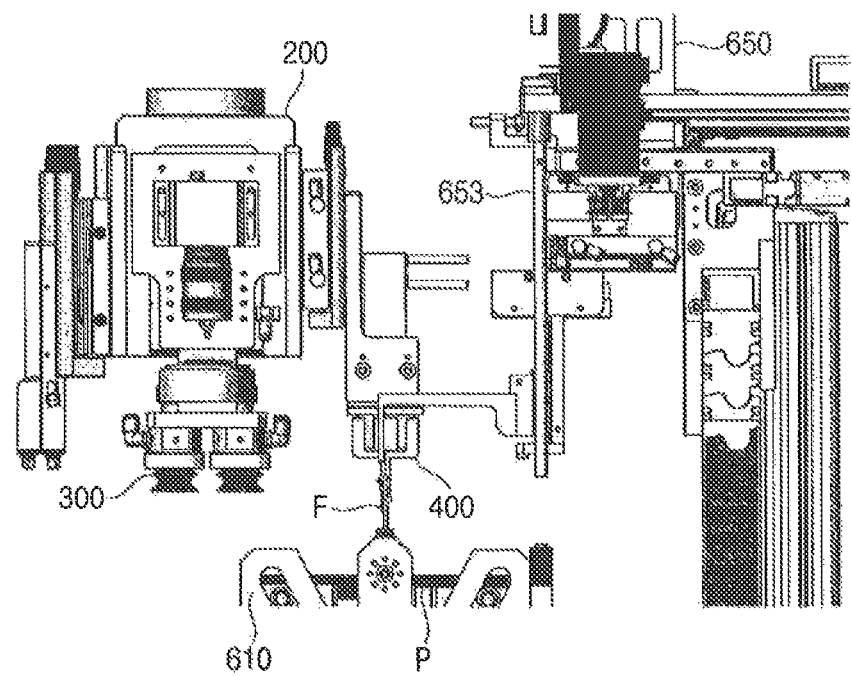
Figure 17:
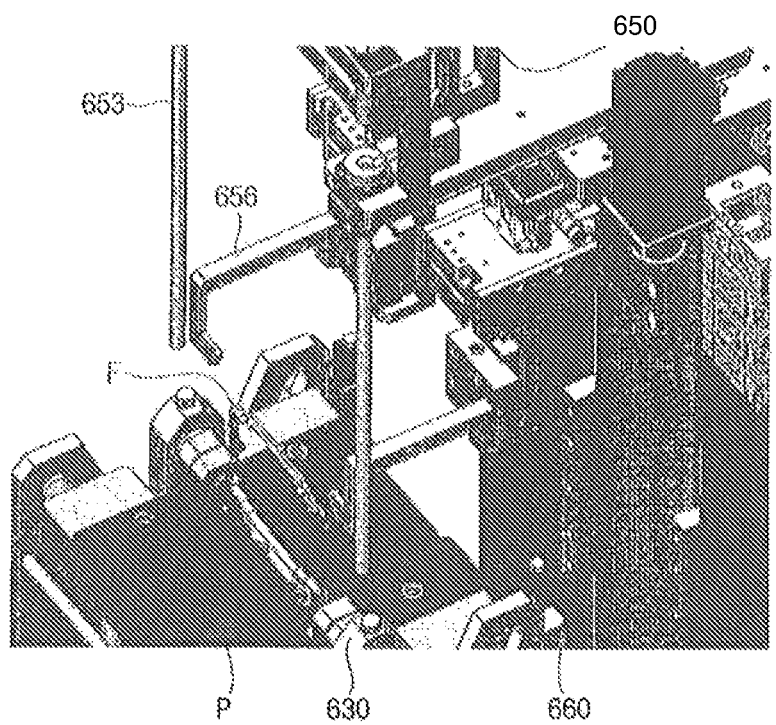
Figure 18:
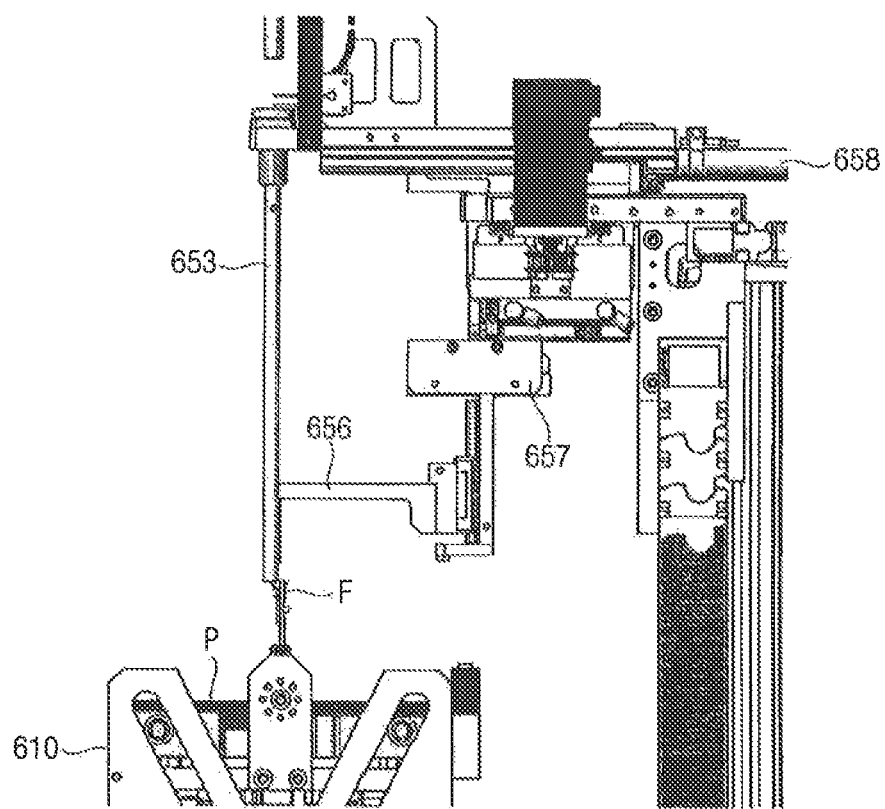

FIG. 11 is a perspective view illustrating a combining mechanism of the apparatus in FIG. 1. FIG. 12 is a perspective view illustrating a pressing member of the combining mechanism in FIG. 11. FIG. 13 is an enlarged perspective view of a portion "A" in FIG. 11. FIG. 14 is an enlarged perspective view of a portion "B" in FIG. 11. FIGS. 15 and 16 are a perspective view and a front view illustrating a process for supplying a frame to a combining mechanism by the multi-joint robot shown in FIG. 1. FIGS. 17 and 18 are a perspective view and a front view illustrating a process for combining PCBs with a frame by a combining mechanism.

Referring to FIG. 11, the combining mechanism 600 may include a jig frame 610, a pair of jig blocks 620 and 622, a pair of clampers 630, a combining member 650, a load sensor 660, a guide shaft 670 and a reaction force cylinder 672.

The jig frame 610 may include a pair of plates arranged opposite to each other. Two guide grooves 612, 614 may be formed at each of the plates. The guide grooves 612, 614 may be inclined with respect to a horizontal plane. The guide grooves 612, 614 may have a V shape.

The jig blocks 620, 622 may be arranged in the jig frame 610. In one exemplary embodiment, the jig blocks 620, 622 may be arranged spaced apart from each other. The upper surfaces of the jig blocks 620, 622 may be configured to receive the PCBs P. The flexible connection member between the PCBs P may be positioned between the jig blocks 620 and 622. Since structures may not exist under the flexible connection member C, the flexible connection member may not be upwardly supported along the vertical direction.

In one exemplary embodiment, guide rollers 621, 623 may be connected to outer side surfaces of the jig blocks 620 and 622. The guide rollers 621, 623 may be rotatably received in the guide grooves 612 and 614. In one exemplary embodiment, when the guide rollers 621, 623 are positioned in uppermost portions of the guide grooves 612, 614, the jig blocks 620, 622 may be horizontally arranged. In contrast, when the guide rollers 621, 623 may be positioned in lowermost portions of the guide grooves 612 and 614, the jig blocks 620, 622 may form the V shape.

The clampers 630 may be arranged over the flexible connection member between the PCBs P. The clampers 630 may be positioned between the jig blocks 620 and 622. Inner side surfaces of the jig blocks 620, 622 may be pivotally connected to the clampers 630. In one exemplary embodiment, when the clampers 630 are moved in a downward direction, the guide rollers 621, 623 may also be moved in a downward direction so that the jig blocks 620, 622 may form the V shape.

Referring to FIGS. 12 and 13, the clampers 630 may be configured to clamp the frame F erected by the rotating mechanism 500. Clamping blocks 640, 642 may be connected to each of the clampers 630. The upper surfaces of the clamping blocks 640, 642 may be configured to receive both lower ends of the erected frame F.

Referring again to FIG. 11, the load sensor 660 may be arranged on the upper surface of the jig block 610. The load sensor 660 may be configured to measure a pressure applied to the clampers 630 by the combining member 650.

In one exemplary embodiment, the guide shaft 670 may be connected to lower surfaces of the jig blocks 620 and 622. The guide shaft 670 may be extended from the lower surfaces of the jig blocks 620, 622 in the vertical direction. The guide shaft 670 may be configured to guide the opening/closing operations of the jig blocks 620 and 622. The guide shaft 670 may include a plurality of shafts.

The reaction force cylinder 672 may be configured to upwardly support a lower end of the guide shaft 670. The reaction force cylinder 672 may upwardly support the guide shaft 670 to buffer operations of the jig blocks 620 and 622.

Referring to FIGS. 12 and 15 to 17, in one exemplary embodiment the combining member 650 may include a combining frame 651, a first actuator 652, a pressing shaft 653, a pressure sensor 654, a regulator 655, a pair of clamping rods 656, a second actuator 657 and a third actuator 658.

The third actuator 658 may be configured to move the combining frame 651 in the horizontal direction. The third actuator 658 may move the combining frame 651 over the jig blocks 620 and 622. The third actuator 658 may include an air cylinder.

The second actuator 657 may be installed at a lower surface of the combining frame 651. In one exemplary embodiment, the second actuator 657 may be configured to open and close the clamping rods 656 in the horizontal direction. The clamping rods 656 may be configured to clamp both upper ends of the frame F on the clamping blocks 640 and 642. The second actuator 657 may include an air cylinder.

The first actuator 652 may be installed at an upper surface of the combining frame 651. The first actuator 652 may be configured to vertically move the pressing shaft 653. The pressing shaft 653 may be configured to press the load sensor 660. The pressure sensor 656 may be configured to measure a pressure applied to the load sensor 660 by the pressing shaft 653. The regulator 655 may control the pressure of the pressing shaft 653 measured by the pressure sensor 656.

The pressing shaft 653 having the pressure controlled by the regulator 655 may be configured to downwardly press the clampers 630. Thus, an optimal pressure may be transferred from the pressing shaft 653 to the flexible connection member through the frame F.

Figure 19:
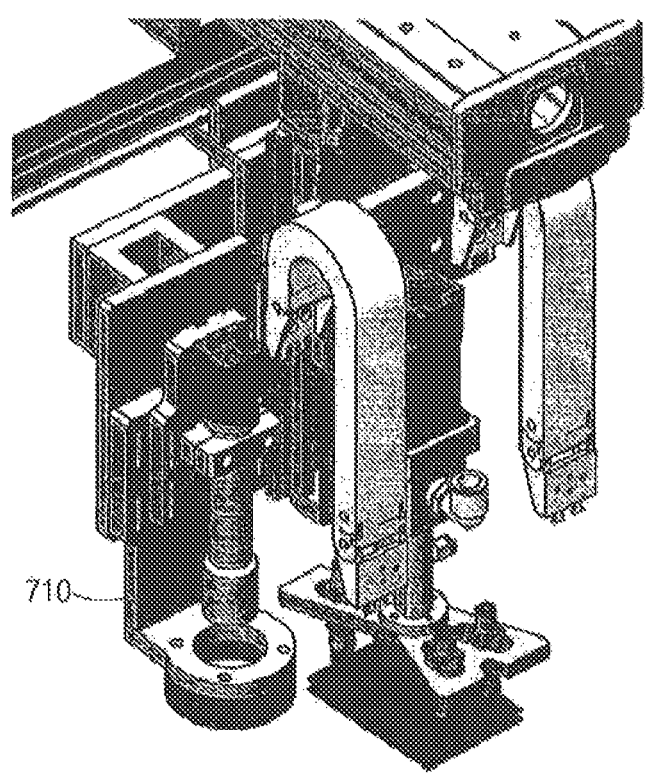
Figure 20:
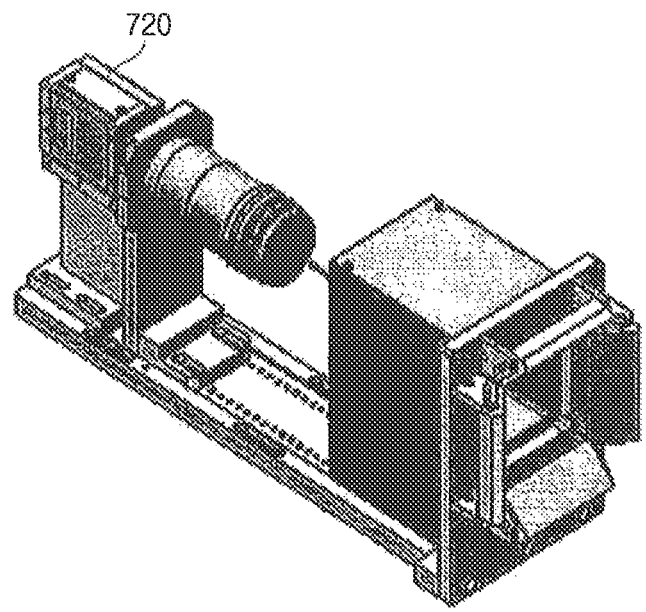
Figure 21:
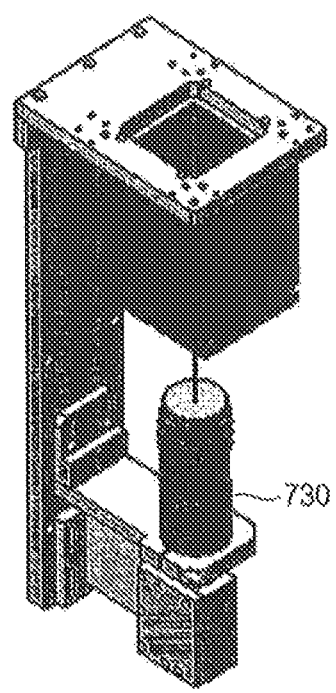
Figure 22:
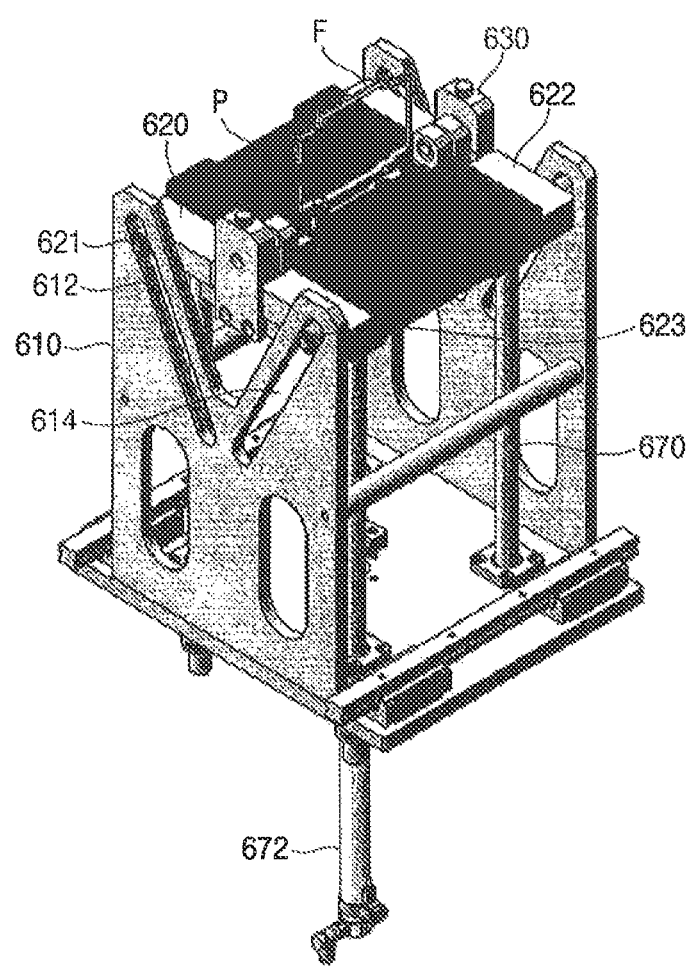
Figure 23:
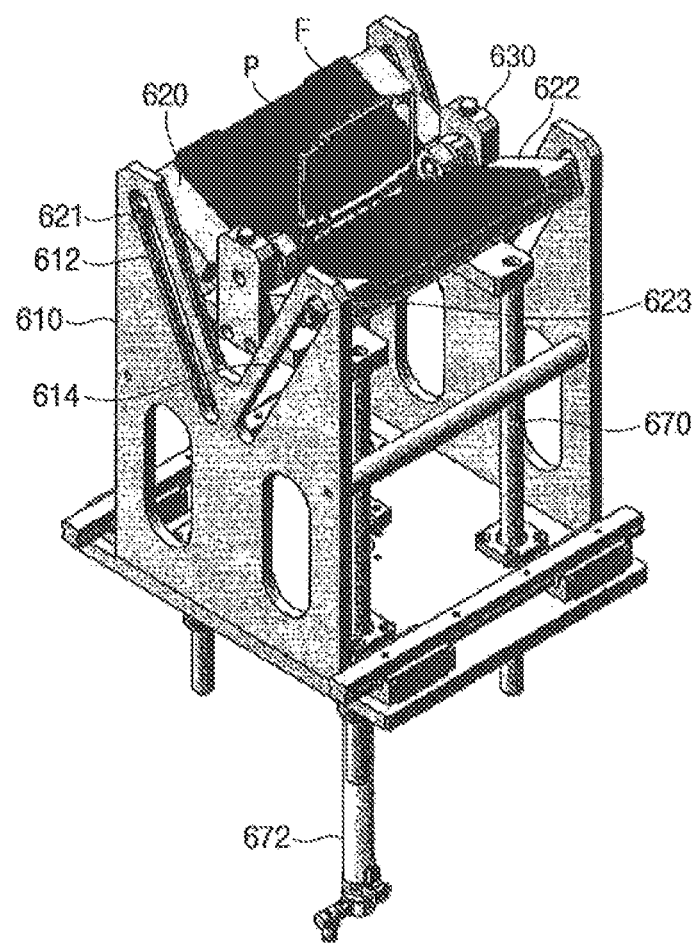
Figure 24:
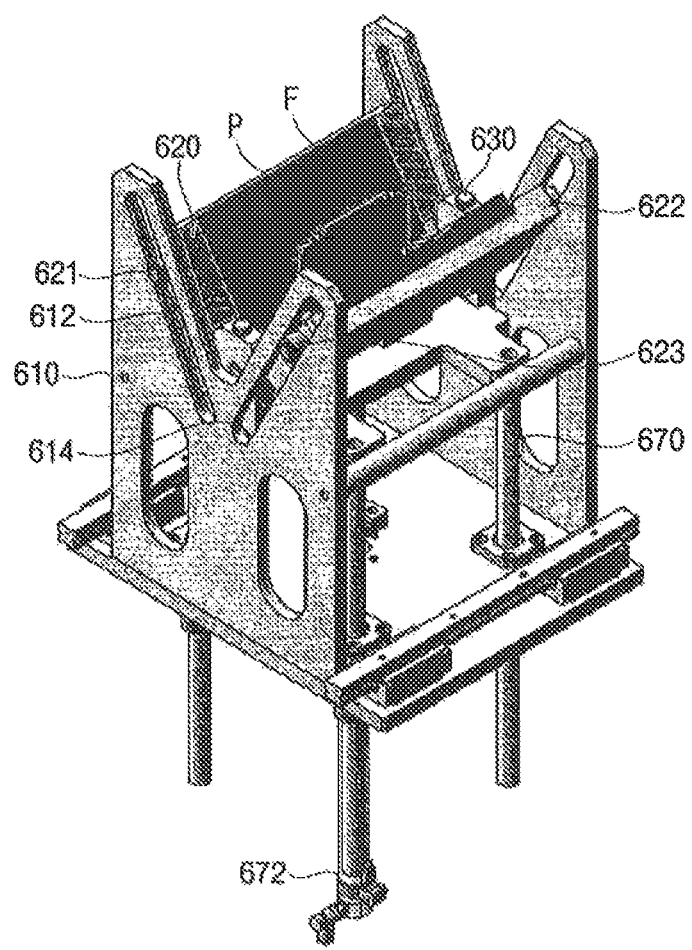
Figure 25:
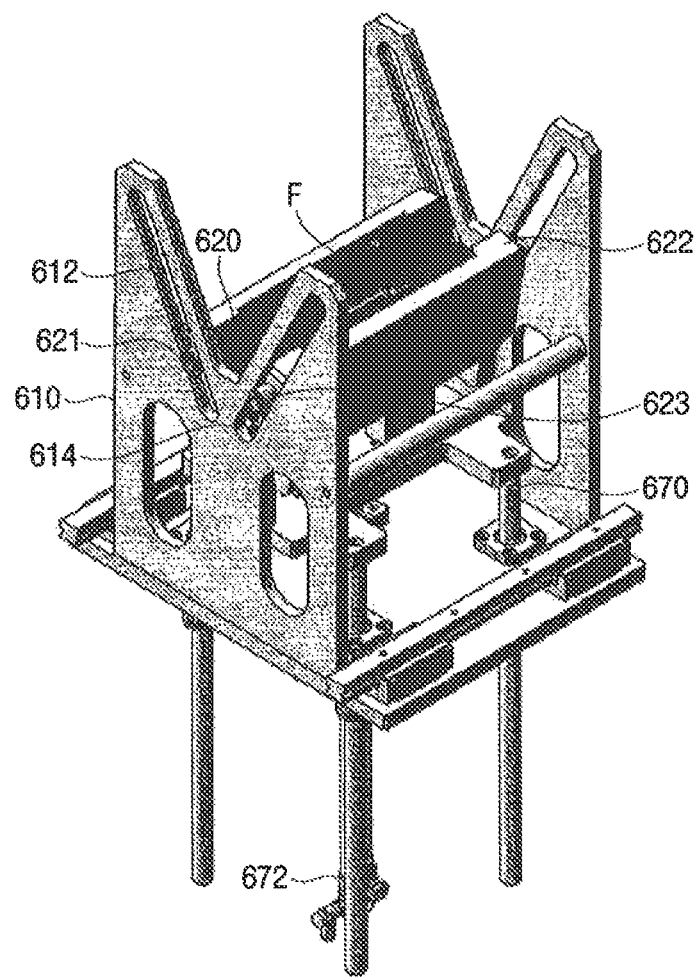

FIG. 19 is a perspective view illustrating an upper camera of an inspecting mechanism of the apparatus in FIG. 1. FIG. 20 is a perspective view illustrating a side camera of an inspecting mechanism of the apparatus in FIG. 1. FIG. 21 is a perspective view illustrating a lower camera of an inspecting mechanism of the apparatus in FIG. 1.

As shown in FIG. 19, the upper camera 710 may be configured to image (e.g., photograph) upper surfaces of the PCBs P combined with the frame F. As shown in FIG. 20, the side camera 720 may be configured to image (e.g., photograph) side surfaces of the PCBs P combined with the frame F. As shown in FIG. 21, the lower camera 730 may be configured to image (e.g., photograph) lower surfaces of the PCBs P combined with the frame F.

The images acquired by the upper camera 710, the side camera 720 and the lower camera 730 may indicate whether the PCBs P are accurately combined with the frame F or if the frame F is damaged.

Hereinafter, operations for combining the PCBs with the frame using the combining apparatus may be illustrated in detail.

The tray with the PCBs P may be loaded into the PCB-loading mechanism 110. The tray with the frames F may be loaded into the frame-loading mechanism 120.

The multi-joint robot 200 may be configured to arrange the pick-up mechanism 300 over the PCB-loading mechanism 110. The vacuum pad 310 of the pick-up mechanism 300 may be configured to pick-up the PCBs P.

The multi-joint robot 200 may be configured to arrange the gripping mechanism 400 over the frame-loading mechanism 120. The grippers 420, 422 of the gripping mechanism 400 may be configured to grip the first side portion of the horizontally arranged frame F.

The multi-joint robot 200 may be configured to transfer the pick-up mechanism 300 and the gripping mechanism 400 to the vision mechanism 900. The vision mechanism 900 may image the PCBs P held by the pick-up mechanism 300 and the frame F gripped by the gripping mechanism 400.

The images photographed by the vision mechanism 900 may permit verification of whether the PCBs P are accurately held by the vacuum pad 310 and if the frame F is accurately gripped by the grippers 420, 422. For example, the PCBs P that may be reversely held by the vacuum pad 310 may be verified based on the images acquired by the vision mechanism 900. When the PCBs P are not accurately held by the vacuum pad 310 and/or the frame F is not accurately gripped by the grippers 420 and 422, processes for aligning the PCBs P and/or the frame F may be additionally performed.

For example, when the vacuum pad holds reversed PCBs P, the multi-joint robot 200 may transfer the pick-up mechanism 300 to the reversing mechanism 800.

The pick-up mechanism 300 may place the reversed PCB P on the upper surface of the first table 820 of the reversing mechanism 800. The first table 820 may then be moved in a downward direction. In one exemplary embodiment, the actuator 850 may rotate the second table 830 toward the first table 820 at an angle of about 180°. The vacuum pad 840 may be configured to hold the reversed PCB P. The actuator 850 may be configured to rotate the second table 830 to the original position at an angle of about 180°. Thus, the PCB P on the second table 830 may be reversed into a proper orientation. The pick-up mechanism 300 may pick up the PCB P using the vacuum.

The multi-joint robot 200 may be configured to transfer the gripping mechanism 400 to the rotating mechanism 500. The grippers 550, 552 may be closed by the second actuator 540 of the rotating mechanism 500 in the vertical direction so that the grippers may grip the second side portion of the horizontal arranged frame F.

The first actuator 520 may be configured to rotate the bracket 530 and the grippers 550, 552 at an angle of about 90°. Thus, the frame F gripped by the grippers 550, 552 may be erected by the rotating mechanism.

While the rotating mechanism 500 is erecting the frame F, the multi-joint robot 200 may be configured to transfer the pick-up mechanism 300 to the combining mechanism 600. The PCBs P held by the pick-up mechanism 300 may be placed on the upper surfaces of the jig blocks 520 and 622.

The multi-joint robot 200 may be configured to transfer the gripping mechanism 400 to the rotating mechanism 500. The gripping mechanism 400 may grip the erected frame F. The multi-joint robot 200 may be configured to transfer the gripping mechanism 400 to the combining mechanism 600. The erected frame F gripped by the gripping mechanism 400 may be placed on the upper surfaces of the clamping blocks 640, 642 of the combining mechanism 600.

In one exemplary embodiment, the pressing shaft 653 may press the load sensor 660 prior to pressing the clampers 630. The pressure sensor 654 may be configured to measure the pressure of the pressing shaft 653 applied to the load sensor 660. The regulator 655 may be configured to control the pressure measured by the pressure sensor 654 to prevent damage of the PCBs P and bending of the flexible connection member C.

The third actuator 658 of the combining member 650 may be configured to move the combining frame 651 in a forward direction to position the pressing shaft 653 over the clampers 630. The clamping rods 656 may be closed in the horizontal direction by the second actuator 657 to firmly clamp the both upper ends of the frame F on the clamping blocks 640 and 642 by the clamping rods 656.

FIGS. 22 to 25 are perspective views illustrating a process for combining PCBs with a frame by a combining mechanism.

Referring to FIGS. 22 to 25, the pressing shaft 653 having a controlled pressure may downwardly press the clampers 630 by the first actuator 652. Thus, the clampers 630 may be downwardly moved so that the frame F may also be downwardly moved to bend the flexible connection member.

The guide rollers 621 and 623 may be downwardly moved in the guide grooves 612 and 614 so that the jig blocks 620, 622 may be overlapped with each other in the V shape. Thus, the PCBs P on the jig blocks 620, 622 may be bent along the flexible connection member to combine the PCBs P with the frame F.

The upper camera 710 in FIG. 19 may be configured to image (e.g., photograph) upper surfaces of the PCBs P combined with the frame F. The side camera in 720 FIG. 20 may be configured to image (e.g., photograph) side surfaces of the PCBs P combined with the frame F. The lower camera 730 in FIG. 21 may be configured to photograph lower surfaces of the PCBs P combined with the frame F. The images acquired by the upper camera 710, the side camera 720 and the lower camera 730 may indicate whether the PCBs P have been accurately combined with the frame F and if the frame F is damaged.

The normal PCBs among the PCBs P combined with the frame F identified by an inspection mechanism including the upper, side and the lower cameras 710, 720, 730 may be unloaded to the normal PCB-unloading mechanism 140. The abnormal PCBs among the PCBs P combined with the frame F identified by an inspection mechanism may be unloaded to the abnormal PCB-unloading mechanism 142.

According to exemplary embodiments, the pick-up mechanism may pick-up the PCBs and the gripping mechanism may grip the frame. When the multi-joint robot transfers the pick-up mechanism and the gripping mechanism to the combining mechanism, the combining mechanism may press the flexible connection member using the frame to combine the PCBs with the frame. Thus, the process for combining the PCBs with the frame may be automatically performed which may significantly decrease the time required to combine the PCBs with the frame and significantly reduce errors of the combining process.

The foregoing is illustrative of exemplary embodiments and is not to be construed as limiting thereof. Although a few exemplary embodiments have been described, those skilled in the art will readily appreciate that many modifications are possible in the exemplary embodiments without materially departing from the novel teachings and advantages of the present invention. Accordingly, all such modifications are intended to be included within the scope of the present invention as defined in the claims. In the claims, means-plus-function clauses are intended to cover the structures described herein as performing the recited function and not only structural equivalents but also equivalent structures. Therefore, it is to be understood that the foregoing is illustrative of various exemplary embodiments and is not to be construed as limited to the specific exemplary embodiments disclosed, and that modifications to the disclosed exemplary embodiments, as well as other exemplary embodiments, are intended to be included within the scope of the appended claims.

What is claimed is:

1. An apparatus for combining printed circuit boards (PCBs) with frames, the apparatus comprising:
    a pick-up mechanism configured to pick up two adjacent PCBs connected to each other via a flexible connection member;
    a gripping mechanism configured to grip a frame; and
    a combining mechanism configured to receive the PCBs connected via the flexible connection member picked up by the pick-up mechanism, receive the frame gripped by the gripping mechanism, and press the flexible connection member using the frame to combine the two adjacent PCBs with the frame, wherein the frame is interposed between the two adjacent PCBs after being combined by the combining mechanism.

2. The apparatus of claim 1, wherein the pick-up mechanism comprises:
    a vacuum pump; and
    a vacuum pad for holding the PCBs using a vacuum provided by the vacuum pump.

3. The apparatus of claim 2, wherein the vacuum pad comprises a pad that is configured to generate a Coanda effect.

4. The apparatus of claim 1, wherein the gripping mechanism comprises:
    an actuator; and
    a pair of first grippers that are configured to be horizontally moved by the actuator to grip a first side portion of a horizontally-arranged portion of the frame.

5. The apparatus of claim 4, further comprising a rotating mechanism configured to vertically rotate the frame gripped by the pair of first grippers.

6. The apparatus of claim 5, wherein the rotating mechanism comprises:
    a pair of second grippers that are configured to be movable vertically to grip a second portion of the frame;
    a first actuator configured to vertically move the second grippers; and
    a second actuator configured to rotate the first actuator to erect the frame.

7. The apparatus of claim 1, further comprising a vision mechanism configured to image the PCBs held by the pick-up mechanism and the frame gripped by the gripping mechanism for aligning the PCBs with the frame.

8. The apparatus of claim 7, further comprising a reversing mechanism configured to reverse the PCBs when images generated by the vision mechanism indicate that the PCBs are reversely held by the pick-up mechanism.

9. The apparatus of claim 8, wherein the reversing mechanism comprises:
    a reversing frame;
    a first table movably connected to the reversing frame in a vertical direction and configured to receive the PCBs;
    a second table rotatably connected to the reversing frame;
    a vacuum pad arranged on the second table, the vacuum pad being configured to hold the PCBs; and
    an actuator configured to rotate the second table.

10. The apparatus of claim 1, further comprising a multi-joint robot for transferring the pick-up mechanism and the gripping mechanism.

11. The apparatus of claim 1, wherein the combining mechanism comprises:
    jig blocks configured to receive the PCBs;
    a jig frame configured to rotatably support the jig blocks;
    a pair of clampers movable between the jig blocks in a vertical direction, the pair of clampers being configured to clamp a vertically arranged portion of the frame over the flexible connection member; and
    a combining member configured to downwardly press the clampers and the flexible connection member to combine the PCBs with the frame.

12. The apparatus of claim 11, wherein guide rollers are connected to side surfaces of the jig blocks, and the jig frame has guide grooves inclined with respect to surfaces of the jig blocks to movably receive the guide rollers.

13. The apparatus of claim 11, wherein the jig blocks are pivotally connected with the clampers via hinge pins.

14. The apparatus of claim 11, wherein the combining mechanism further comprises a movable guide shaft positioned in the jig frame, the guide shaft being connected to the clampers and configured to guide vertical movement of the clampers.

15. The apparatus of claim 14, wherein the combining mechanism further comprises a reaction force cylinder configured to upwardly support the guide shaft as the guide shaft is moved downwardly by the combining member.

16. The apparatus of claim 11, wherein the combining member comprises:
    an actuator; and
    a pressing shaft configured to be downwardly moved by the actuator to press the clampers.

17. The apparatus of claim 16, wherein the combining member further comprises:

a load sensor arranged on the jig frame, the load sensor being configured to measure a pressure of the pressing shaft;

a regulator configured to control the pressure of the pressing shaft; and clamping rods configured to clamp both upper ends of the frame clamped by the clampers.

18. An apparatus for combining printed circuit boards (PCBs) with frames, the apparatus comprising:

a pick-up mechanism configured to pick up two adjacent PCBs connected to each other via a flexible connection member;

a gripping mechanism configured to grip a horizontally arranged portion of a frame;

a rotating mechanism configured to erect the frame gripped by the grippers;

a combining mechanism configured to receive the PCBs connected via the flexible connection member picked up by the pick-up mechanism, receive the frame gripped by the gripping mechanism, and press the flexible connection member using the frame to combine the two adjacent PCBs with the frame, wherein the frame is interposed between the two adjacent PCBs after being combined by the combining mechanism; and a multi-joint robot configured to transfer the pick-up mechanism and the gripping mechanism to the rotating mechanism and the combining mechanism.

19. The apparatus of claim 18, wherein the combining mechanism comprises:

jig blocks configured to receive the PCBs;

a jig frame configured to rotatably support the jig blocks;

a pair of clampers arranged between the jig blocks, the clampers being movable in a vertical direction to clamp a vertically arranged portion of the frame over the flexible connection member; and a combining member configured to downwardly press the clampers and the flexible connection member to combine the PCBs with the frame.

20. A method for combining a plurality of printed circuit boards (PCBs) with frames, the PCBs having two adjacent PCBs connected to each other via a flexible connection member, comprising:

picking up the two adjacent PCBs connected to each other via the flexible connection member by a pick-up mechanism;

gripping a frame by a gripping mechanism;

transferring the picked up PCBs and the gripped frame to a combining mechanism; and pressing the flexible connection member using the frame to combine the two adjacent PCBs with the frame by the combining mechanism, wherein the frame is interposed between the two adjacent PCBs after being combined by the combining mechanism.

* * * * *